United States Patent
Jeon et al.

(10) Patent No.: US 8,680,928 B2
(45) Date of Patent: Mar. 25, 2014

(54) POWER AMPLIFIER INCLUDING VARIABLE CAPACITOR CIRCUIT

(75) Inventors: Moon Suk Jeon, Seoul (KR); Jung-Rin Woo, Seoul (KR); Sang Hwa Jung, Kyunggi-do (KR); Young Kwon, Thousand Oaks, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/433,957

(22) Filed: Mar. 29, 2012

(65) Prior Publication Data

US 2013/0257545 A1   Oct. 3, 2013

(51) Int. Cl.
   *H03F 1/22*   (2006.01)
(52) U.S. Cl.
   USPC .......................................................... 330/311
(58) Field of Classification Search
   USPC .................. 330/277, 296, 311, 310
   See application file for complete search history.

(56) References Cited

U.S. PATENT DOCUMENTS

| | | | |
|---|---|---|---|
| 5,061,903 A * | 10/1991 | Vasile | 330/311 |
| 5,304,946 A * | 4/1994 | Sano et al. | 330/311 |
| 6,496,074 B1 * | 12/2002 | Sowlati | 330/311 |
| 6,864,750 B2 * | 3/2005 | Shigematsu | 330/311 |
| 7,071,786 B2 * | 7/2006 | Inoue et al. | 330/311 |
| 7,248,120 B2 * | 7/2007 | Burgener et al. | 330/311 |
| 8,018,288 B2 | 9/2011 | Duster et al. | |
| 8,064,622 B1 | 11/2011 | Opris | |
| 2007/0075784 A1 | 4/2007 | Pettersson et al. | |
| 2009/0243727 A1 | 10/2009 | Bockelman et al. | |
| 2011/0181360 A1 | 7/2011 | Li et al. | |

OTHER PUBLICATIONS

Chengzhou Wang et al., "A Capacitance-Compensation Technique for Improved Linearity in CMOS Class-AB Power Amplifiers", IEEE Journal of Solid-State Circuits, vol. 39, No. 11, Nov. 2004, pp. 1927-1937.

* cited by examiner

*Primary Examiner* — Khanh V Nguyen

(57) ABSTRACT

A power amplifier includes first and second amplification stages. The first amplification stage is configured to amplify a radio frequency (RF) input signal. The second amplification stage includes at least one transistor configured to amplify an output of the first amplification stage, the second amplification stage being configured to have a capacitance between a gate of the at least one transistor and a first power supply voltage. The capacitance automatically varies with amplitude of the output of the first amplification stage.

18 Claims, 5 Drawing Sheets

POWER AMPLIFIER INCLUDING VARIABLE CAPACITOR CIRCUIT

BACKGROUND

In order to integrate an entire transceiver system of a communication system into a single integrated circuit (IC), attempts have been made to replace conventional gallium arsenide (GaAs) power amplifiers with high-efficiency complementary metal-oxide semiconductor (CMOS) power amplifiers. However, radio frequency (RF) characteristics, e.g., non-linear characteristics, of CMOS power amplifiers generally impede their use in communication systems. Although efficiency of CMOS power amplifiers approach that of GaAs power amplifiers, linearity of CMOS power amplifiers has not been significantly improved, particularly due to intrinsic non-linearity of CMOS field-effect transistors (FETs) used in CMOS power amplifiers.

Non-linear distortion of a transistor device may be categorized as amplitude modulation-amplitude modulation distortion ("AM-AM distortion") and amplitude modulation-phase modulation distortion ("AM-PM distortion"). In general, when amplitude of a voltage swing becomes close to knee voltage of the transistor device, transmission conductance determining gain of the transistor device decreases, and therefore the gain decreases. A CMOS FET has a higher knee voltage than a GaAs heterojunction bipolar transistor (GaAs HBT) or a GaAs FET, for example. Therefore, reduction in the gain of a CMOS FET generally occurs relative to a lower output power than reduction in the gain of a GaAs-based amplifier, and therefore a CMOS power amplifier tends to have a narrower linear operation region than a GaAs power amplifier.

In order to provide desired linearity, a CMOS power amplifier must be operated in a large back-off power region (or voltage region) that is narrower than an operation region of a conventional power amplifier, e.g., a GaAs power amplifier. However, when the CMOS FET of the CMOS power amplifier is operated in a back-off power region, efficiency of the CMOS power amplifier generally decreases. Therefore, it may be necessary to reduce non-linearity of the CMOS power amplifier in order to increase the efficiency of the CMOS power amplifier.

BRIEF DESCRIPTION OF THE DRAWINGS

The described embodiments are best understood from the following detailed description when read with the accompanying drawing figures. It is emphasized that the various features are not necessarily drawn to scale.

DETAILED DESCRIPTION OF EMBODIMENTS

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. In addition, unless expressly so defined herein, terms are not to be interpreted in an overly idealized fashion.

Figure 1:
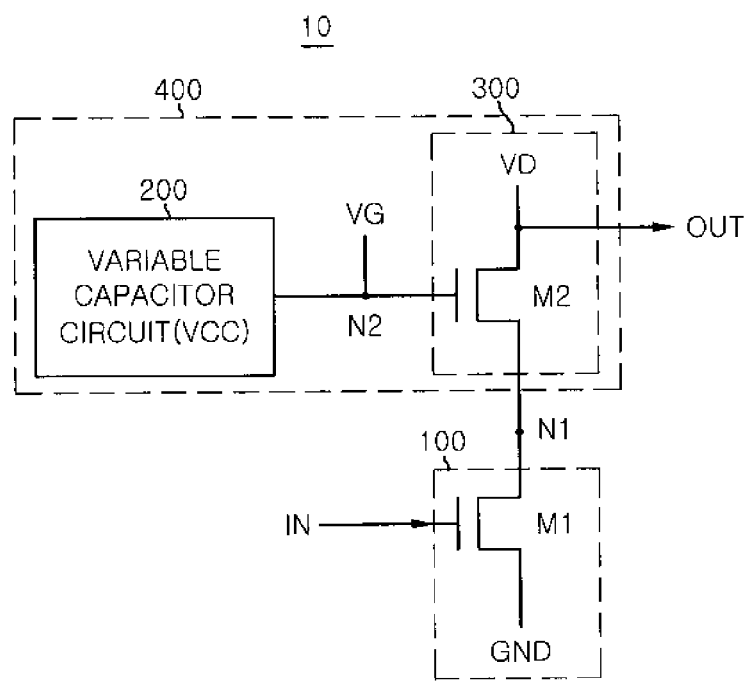
FIG. 1 is a simplified block diagram illustrating a power amplifier, in accordance with a representative first embodiment.

FIG. 1 is a simplified block diagram illustrating a power amplifier 10 in accordance with a representative first embodiment.

Referring to FIG. 1, the power amplifier 10 includes a first amplification stage 100 and a second amplification stage 400 connected in cascade to the first amplification stage 100. The first amplification stage 100 includes a transistor M1 connected between the second amplification stage 400 and a first power supply voltage GND. The first amplification stage 100 may be a common-source amplification stage, and the transistor M1 may be a common-source transistor, for example. In this case, the transistor M1 includes a source connected to the first power supply voltage GND, a drain connected to the second amplification stage 400 (via first node N1), and a gate configured to receive input RF signal IN. The transistor M1 amplifies the RF signal IN, and outputs the amplified RF signal IN via its drain. The first power supply voltage GND may be a ground voltage (0 V), for example.

The second amplification stage 400 is connected in cascade to the first amplification stage 100. The second amplification stage 400 includes a variable capacitor circuit 200 and a transistor 300. The transistor 300 includes a common-gate transistor M2, which has a source connected to the transistor M1, a drain connected to a second power supply voltage VD and an output terminal OUT, and a gate connected to second node N2. The RF signal IN input via the first amplification stage 100 is amplified by the common-source transistor M1 and the common-gate transistor M2. The amplified RF signal IN is output via the output terminal OUT. As described above, the second amplification stage 400 may be a common-gate amplification stage.

A gate bias voltage VG may be applied to the gate of the common-gate transistor M2 (via second node N2). For example, the gate bias voltage VG may be generated by voltage division using the first and second power supply voltages GND and VD, or may be generated using a separate power supply voltage.

The variable capacitor circuit 200 is connected between the gate of the common-gate transistor M2 and the first power supply voltage GND. The variable capacitor circuit 200 has a capacitance that varies depending on a voltage swing of the gate of the common-gate transistor M2, and therefore the variable capacitor circuit 200 functions as a linearizer for mitigating non-linearity of the power amplifier 10. As mentioned above, the first power supply voltage GND may be a ground voltage.

When the RF signal IN is input to the power amplifier 10, the output of the first amplification stage 100 is an RF signal having an amplified voltage swing (corresponding to amplitude). When the output signal of the first amplification stage 100 has a voltage swing, the gate of the common-gate transistor M2 has a voltage swing generated by voltage division based on a gate-source capacitance and a gate shunt capacitance, i.e., the capacitance of the variable capacitor circuit 200. That is, the capacitance of the variable capacitor circuit 200 varies depending on the voltage or phase of the voltage swing of the gate of the common-gate transistor M2. For example, the variable capacitor circuit 200 may have an average capacitance increasing in proportion to a duration during which the voltage swing of the gate of the common-gate transistor M2 has a voltage higher than a threshold voltage. The threshold voltage may be set to a different value depending on characteristics of devices included in the variable capacitor.

Figure 4:
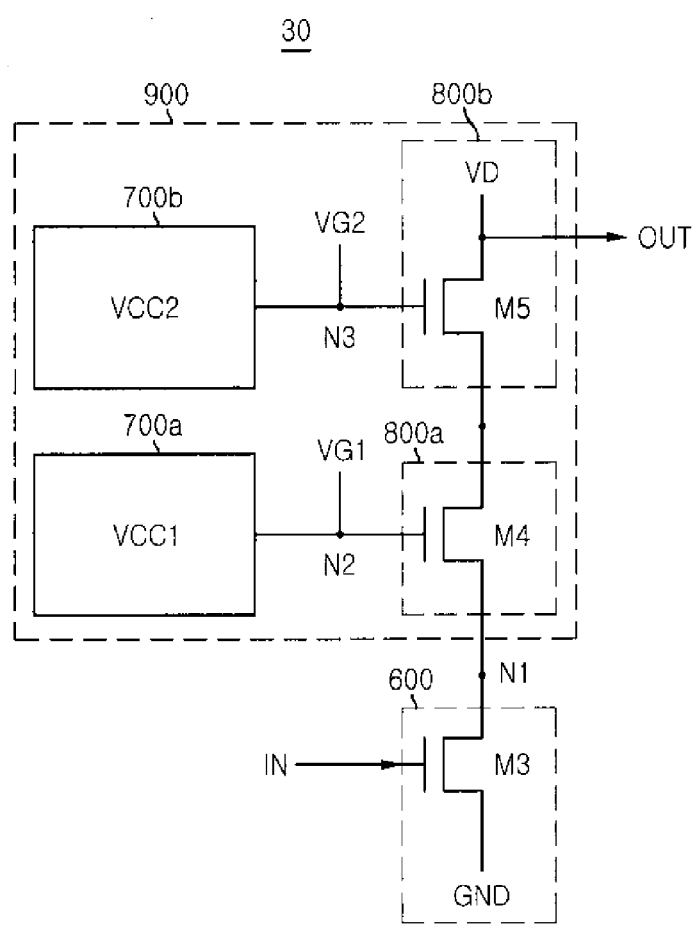
FIG. 4 is a simplified block diagram illustrating a power amplifier, in accordance with a representative second embodiment.

The power amplifier 10 may be a complementary metal-oxide semiconductor (CMOS) power amplifier, for example, in which case, the common-source transistor M1 and the common-gate transistor M2 may be CMOS field-effect transistors (FETs). Since the CMOS power amplifier is implemented using CMOS FETs having lower breakdown voltages than GaAs-based devices, the CMOS power amplifier may have a cascode structure, as shown in FIG. 1, or a stacked structure, as shown in FIG. 4 (discussed below), in order to prevent the breakdown of the CMOS FETs. The transistors M1 and M2 may be N-type CMOS FETs or P-type CMOS FETs. However, when the transistors M1 and M2 are P-type transistors, the transistors M1 and M2 and the variable capacitor circuit may have a connection configuration different from that shown in FIG. 1, and the first power supply voltage has a voltage depending on the circuit configuration, as would be apparent to one of ordinary skill in the art.

In the power amplifier 10, according to the first embodiment, the gate of the common-gate transistor M2 is signal-grounded via the variable capacitor circuit 200 that provides a variable capacitance, as opposed to a constant or fixed capacitance. Accordingly, the common-gate transistor M2 may have an adaptive gate capacitance depending on the input or output power of the power amplifier 10. As will be described with reference to FIGS. 5 to 8, the power amplifier 10 has a gate capacitance that gradually increases as the output power of the power amplifier 10 increases, which mitigates AM-AM distortion and AM-PM distortion of the power amplifier 10, as compared to a conventional power amplifier.

Figure 2:
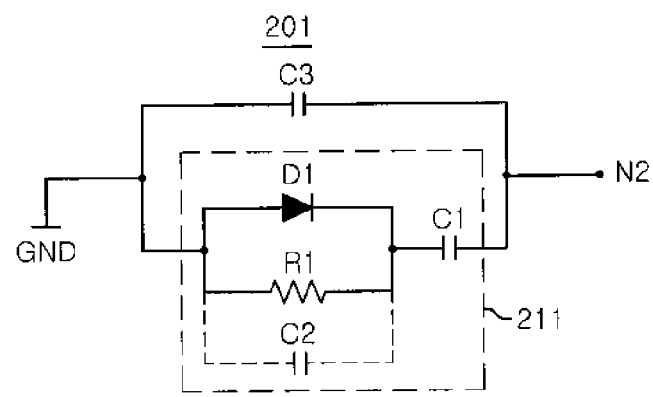
FIGS. 2 and 3 are simplified circuit diagrams illustrating examples of a variable capacitor circuit included in the power amplifier of FIG. 1, according to representative embodiments.
Figure 3:
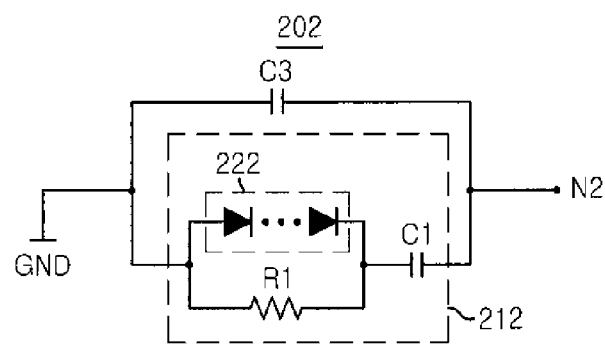

FIGS. 2 and 3 are simplified circuit diagrams illustrating examples of the variable capacitor circuit included in the power amplifier of FIG. 1, according to representative embodiments.

Referring to FIGS. 1 and 2, the variable capacitor circuit 200 is shown as variable capacitor circuit 201, which includes a diode circuit 211 including a first capacitor C1, a diode D1 and a resistor R1. The diode D1 is connected in parallel to the resistor R1. The first capacitor C1 is connected in series to the diode D1 and the resistor R1 that are connected in parallel to each other. One terminal of the first capacitor C1 is connected to a second node N2, and one terminal of the diode D1 and the resistor R1 that are connected in parallel to each other is connected to a first power supply voltage GND. The diode D1 may have parasitic capacitance C2, indicated by the dashed line. In another embodiment, the terminal connections may be reversed, such that one terminal of the first capacitor C1 may be connected to the first power supply voltage GND, and one terminal of the diode D1 and the resistor R1 that are connected in parallel to each other may be connected to the second node N2. The variable capacitor circuit 201 includes a third capacitor C3 connected in parallel to the diode circuit 211.

The variable capacitor circuit 201 is connected between the gate of the transistor M2 of the second amplification stage 400, i.e., the second node N2, and the first power supply voltage GND. The power amplifier 10 in accordance with the first embodiment includes the variable capacitor circuit 201 having a variable capacitance, which increases in proportion to the duration during which the voltage swing of the gate of the common-gate transistor M2 has a voltage higher than a threshold voltage. In this case, the threshold voltage may vary depending on the device characteristics of the diode D1 included in the variable capacitor circuit 201. Although not shown in the drawings, the variable capacitor circuit 201 may include a device or circuit instead of the diode D1 that functions as a switch configured to allow current to flow to both ends thereof when an applied voltage is equal to or higher than a specific voltage and to otherwise block the both ends. For example, the variable capacitor circuit 201 may be a transistor device in which a gate and a source (or a drain) thereof are connected to each other, instead of the diode D1.

When the power amplifier 10 operates in a small-signal environment, the variable capacitor circuit 201 has a relatively low capacitance (hereinafter referred to as "first capacitance"). As power of an RF signal input and output to and from the power amplifier 10 increases, the capacitance of the variable capacitor circuit 201 gradually increases from the first capacitance to a relatively high capacitance (hereinafter referred to as "second capacitance"). As described above, the variable capacitor circuit 201 has a capacitance that varies in the range from the first capacitance to the second capacitance as the output power of the power amplifier 10 increases or decreases. As will be described with reference to FIG. 7, the capacitance of the variable capacitor circuit 201 refers to an average capacitance during the specific duration while the power amplifier 10 is performing RF operation. Unless described otherwise below, it should be understood that the capacitance of the variable capacitor circuit that the power amplifier 10 includes refers to the average capacitance for the specific duration during which the power amplifier 10 operates so that it has the same output power.

Further, as will be described with reference to FIG. 7, the capacitance of the variable capacitor circuit 201 during a specific time range increases in proportion to a duration during which the voltage swing of the gate of the common-gate transistor M2 has a voltage higher than a threshold voltage. This duration may be controlled by characteristic(s) of the diode D1, for example, a threshold voltage value of the diode D1. For example, the higher the threshold voltage of the diode D1 of the variable capacitor circuit 201 is, the shorter the duration is with respect to the same output power. A curve of the variation of the capacitance of the variable capacitor circuit 201 based on the output power of the power amplifier 10 may vary depending on the threshold voltage value of the diode D1. The range of the capacitance of the variable capacitor circuit 201 may vary depending on the values of the first capacitor C1, the third capacitor C3, and the second capacitor C2.

As described above, the power amplifier 10 has a capacitance that gradually increases as the output power between the transistor M2 of the second amplification stage 400 and the first power supply voltage GND increases by the variable capacitor circuit 201, that is, the shunt capacitance of the gate, thereby reducing the AM-AM distortion and the AM-PM distortion. Accordingly, the variable capacitor circuit 201 operates as a linearizer for the power amplifier 10.

Referring to FIGS. 1 and 3, the variable capacitor circuit 200 is shown as variable capacitor circuit 202, which includes a diode circuit 212 including a first capacitor C1, multiple diodes 222 and a resistor R1. While the variable capacitor circuit 201 of FIG. 2 includes the single diode D1, the variable capacitor circuit 202 of FIG. 3 includes the multiple diodes 222. Accordingly, the multiple diodes 222 may have a total threshold voltage higher than that of the diode D1 of FIG. 2.

As will be described with reference to FIG. 7, a curve of the variation of the capacitance of the variable capacitor circuit 202 versus output power of the power amplifier 10 varies depending on the total threshold voltage value of the diodes 222. A range of the capacitance of the variable capacitor circuit 202 may also vary depending on the values of the first capacitor C1 and third capacitor C3 and a parasitic capacitance of the diodes 222.

Since the variable capacitor circuit 202 of FIG. 3 is otherwise substantially the same as the variable capacitor circuit 201 of FIG. 2, except that the variable capacitor circuit 202 includes multiple diodes 222, description of like elements will not be repeated.

FIG. 4 is a simplified block diagram illustrating a power amplifier 30 in accordance with a representative second embodiment.

Referring to FIG. 4, the power amplifier 30 is a layered power amplifier, including a first amplification stage 600 and a second amplification stage 900. The first amplification stage 600 is connected between a first power supply voltage GND and the second amplification stage 900, and includes a common-source transistor M3 that receives input RF signal IN via its gate.

The second amplification stage 900 includes first and second transistor circuits 800a and 800b and first and second variable capacitor circuits 700a and 700b. The first transistor circuit 800a includes first common-gate transistor M4 and the second transistor circuit 800b includes second common-gate transistor M5. Although FIG. 4 illustrates a configuration including two common-gate transistors for convenience of illustration, it is understood that the second amplification stage 900 may include a larger number of common-gate transistors, without departing from the scope of the present teachings.

The first common-gate transistor M4 is connected in cascade to the common-source transistor M3 of the first amplification stage 600, and the second common-gate transistor M5 is connected in cascade to the first common-gate transistor M4. As shown in FIG. 4, the first common-gate transistor M4 includes a source connected to the common-source transistor M3 (via first node N1), a drain connected to the second common-gate transistor M5, and a gate connected to second node N2. The second common-gate transistor M5 includes a source connected to the first common-gate transistor M4, a drain connected to a second power supply voltage VD and an output terminal OUT, and a gate connected to third node N3.

An RF signal IN input via the first amplification stage 600 is amplified via the common-source transistor M3, the first common-gate transistor M4 and the second common-gate transistor M5, and is then output via the output terminal OUT.

A first gate bias voltage VG1 may be applied to the gate of the first common-gate transistor M4 (via second node N2), and a second gate bias voltage VG2 may be applied to the gate of the second common-gate transistor M5 (via third node N3). The first and second gate bias voltages VG1 and VG2 may be generated by voltage division using the first and second power supply voltages GND and VD, or may be generated using a separate power supply voltage.

The first variable capacitor circuit 700a is connected between the gate of the first common-gate transistor M4 and the first power supply voltage GND. The first variable capacitor circuit 700a has a capacitance automatically varying with a voltage swing of the gate of the first common-gate transistor M4. The second variable capacitor circuit 700b is connected between the gate of the second common-gate transistor M5 and the first power supply voltage GND. The second variable capacitor circuit 700b has a capacitance automatically varying with a voltage swing of the gate of the second common-gate transistor M5. The first power supply voltage GND may be a ground voltage, for example. Each of the first and second variable capacitor circuits 700a and 700b may have circuit configurations shown in FIGS. 2 and 3, for example.

The first and second variable capacitor circuits 700a and 700b may be configured using different device values, such as different capacitors, different resistors and different diode devices. In this case, a first capacitance range of the first variable capacitor circuit 700a may be different from a second capacitance range of the second variable capacitor circuit 700b as the output power of the power amplifier 30 varies. The first and second capacitance ranges may vary, for example, depending on the device values of the capacitors of the first and second variable capacitor circuits 700a and 700b, respectively.

In the power amplifier 30 in accordance with the second embodiment, the gates of the first and second common-gate transistors M4 and M5 are signal-grounded via the variable capacitances of the first and second variable capacitor circuits 700a and 700b (as opposed to constant or fixed capacitances), respectively. Accordingly, the first and second common-gate transistors M4 and M5 may have adaptive gate capacitances depending on the input or output power of the power amplifier 30. As will be described with reference to FIGS. 5 to 8, the power amplifier 30 has a gate capacitance that gradually increases as the output power of the power amplifier 30 increases, so that AM-AM distortion and AM-PM distortion of the power amplifier 30 may be mitigated as compared to conventional power amplifiers.

Figure 5:
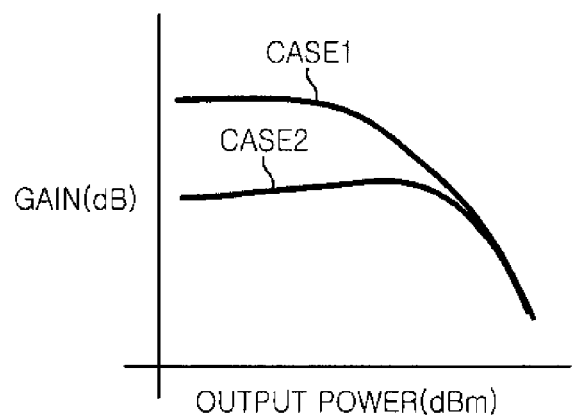
FIG. 5 is a diagram comparing exemplary curves showing gain versus output power of a conventional power amplifier and a power amplifier according to a representative embodiment.

FIG. 5 is a diagram comparing exemplary curves of gain versus output power of a conventional power amplifier and a power amplifier according to a representative embodiment. In FIG. 5, CASE1 is the curve indicating gain of the conventional power amplifier, and CASE2 is the curve indicating gain of the power amplifier of the representative embodiment. Mitigation of the AM-AM distortion of the power amplifier 10 of FIG. 1 will now be described with reference to FIGS. 1, 2 and 5.

Non-linear distortion of a CMOS FET is categorized into AM-AM distortion and AM-PM distortion. Since transmission conductance determining the gain of the CMOS FET device decreases as an amplitude of a voltage swing approaches knee voltage of the transistor device, AM-AM distortion occurs in which gain decreases as the output power of the power amplifier increases. In general, since a CMOS FET has a higher knee voltage than a GaAs HBT or a GaAs FET, for example, reduction in the gain of the CMOS FET occurs at a lower output power than that of the GaAs-based devices.

Meanwhile, phase of the output signal amplified by the power amplifier may be shifted depending on the power (or amplitude) of the input or output signal. AM-PM distortion is one of the non-linear distortions that reduces overall linearity of the power amplifier, and AM-PM distortion may occur alongside AM-AM distortion or independently. The CMOS FET has a relatively high gate-source capacitance, and the gate-source capacitance greatly varies depending on the bias voltage applied between the gate and source of the CMOS FET. As the output power of the CMOS FET power amplifier increases, the gate-source capacitance varies, resulting in occurrence of the result that AM-PM distortion. The non-linear distortions (AM-AM distortion and AM-PM distortion) of the power amplifier cause spectral crosstalk or leakage of signal energy from a desired channel to adjacent channels in a multi-channel communication. The leakage power between adjacent channels may be measured in terms of the adjacent channel power ratio (ACPR) or adjacent channel leakage ratio (ACLR).

Gain of a common-gate amplifier implemented using a common-gate transistor is affected by the shunt capacitance of the gate of the common-gate transistor. For example, when the capacitance of the gate decreases, the gain of the common gate amplifier decreases. When the power amplifier 10 or the second amplification stage 400 in FIG. 1 has a low output power, the shunt capacitance of the gate, that is, the capacitance of the variable capacitor circuit 201, has a relatively small value, and therefore the gain of the power amplifier 10 may decrease compared to that of the conventional power amplifier. As the output power of the power amplifier 10 or second amplification stage 400 increases, the shunt capacitance of the gate, i.e., the capacitance of the variable capacitor circuit 201, gradually increases, and therefore the gain of the power amplifier 10 increases. Accordingly, the variable capacitor circuit 201, having capacitance that increases as the output power increases, compensates for the AM-AM distortion of the power amplifier 10.

Figure 6:
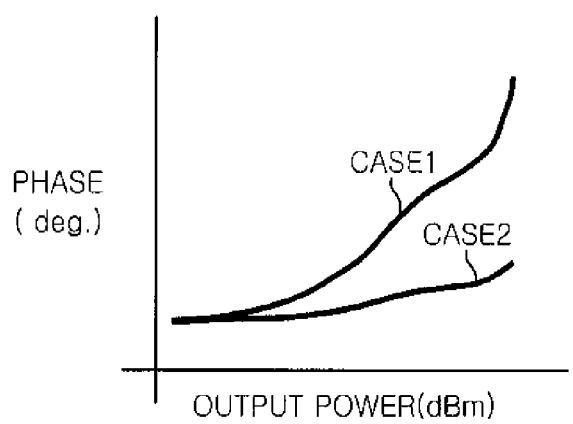
FIG. 6 is a diagram comparing exemplary curves of phase versus output power of a conventional power amplifier and a power amplifier according to a representative embodiment.

FIG. 6 is a diagram comparing exemplary curves of phase versus output power of a conventional power amplifier and a power amplifier according to a representative embodiment. In FIG. 6, CASE1 is a curve indicating phase of the conventional power amplifier, and CASE2 is a curve indicating phase of the power amplifier according to the representative embodiment. The mitigation of the AM-PM distortion of the power amplifier 10 of FIG. 1 will now be described with reference to FIGS. 1, 2 and 6.

The AM-PM distortion of the CMOS power amplifier is chiefly generated by a variation in gate-source capacitance and drain conductance, depending on an output power. In general, the phase shift that occurs in the common-source amplifier increases as the drain conductance of the common-source transistor increases and decreases as the gate-source capacitance increases. Meanwhile, the phase shift that occurs in the common-gate amplifier decreases as the drain conductance or the gate-source capacitance of the common-gate transistor increases. Furthermore, as the output power of the CMOS power amplifier increases, the gate-source capacitance decreases and the drain conductance increases.

Accordingly, as the output of the CMOS power amplifier increases, the drain conductance of the common-source transistor increases, thereby increasing the phase shift of the output signal, and the gate-source capacitance decreases, thereby also increasing the phase shift of the output signal.

Furthermore, as the output of the CMOS power amplifier increases, the drain conductance of the common-gate transistor increases, thereby reducing the phase shift of the output signal, and the gate-source capacitance decreases, thereby increasing the phase shift of the output signal. As described above, the AM-PM distortion is more affected by the gate-source capacitance than the drain conductance of the CMOS transistor. Since the gate-source capacitance decreases as the output power of the CMOS power amplifier increases, the phase shift of the conventional power amplifier increases as the output power increases.

In the case of the conventional cascode power amplifier, the gate of the common-gate transistor is configured to be signal-grounded via a capacitor having a constant capacitance. In this case, as the output power increases, the gate-source capacitance of the common-gate transistor decreases, with the result that the phase of the output of the cascode power amplifier increases. Strictly speaking, as a magnitude of the capacitance in the direction from the drain terminal of the common-source transistor of the cascode amplifier to the gate of the common-gate transistor decreases, the phase of the cascode power amplifier increases.

AM-PM distortion of the power amplifier 10 according to a representative embodiment can decrease in such a way that, as the output power of the second amplification stage 400 increases, the shunt capacitance of the gate of the common-source gate transistor M2, that is, the capacitance of the variable capacitor circuit 201, gradually increases. The reason for this is that as the output power of the power amplifier 10 or second amplification stage 400 increases, the gate-source capacitance of the common-gate transistor M2 of the second amplification stage 400 decreases, while the shunt capacitance of the gate of the common-gate transistor M2, that is, the capacitance of the variable capacitor circuit 201, gradually increases. Accordingly, the capacitance in the direction from the output (that is, drain) of the transistor M1, connected in cascade to the common-source gate M2, to the gate of the common-source gate M2 increases or the amount of reduction of the capacitance decreases as the output power increases. As described above, the capacitance in the direction from the output (that is, drain) of the transistor M1 to the gate of the common-source gate M2 is increased or the amount of reduction of the capacitance is decreased via the variable capacitor circuit 200 having the capacitance that gradually increases as the output power of the second amplification stage 400 increases, and therefore the AM-PM distortion of the power amplifier 10 can be decreased.

Accordingly, the variable capacitor circuit 201 compensates for the AM-PM distortion of the power amplifier 10, where the variable capacitor circuit 201 has capacitance that increases as the output power increases. The first and second capacitors C1 and C3, the resistor R1 and the diode D1 may be selected such that the variable capacitor circuit 201 has a capacitance that varies in a wider range depending on the output power, and in this case, the AM-PM distortion can be compensated more effectively.

Figure 7:
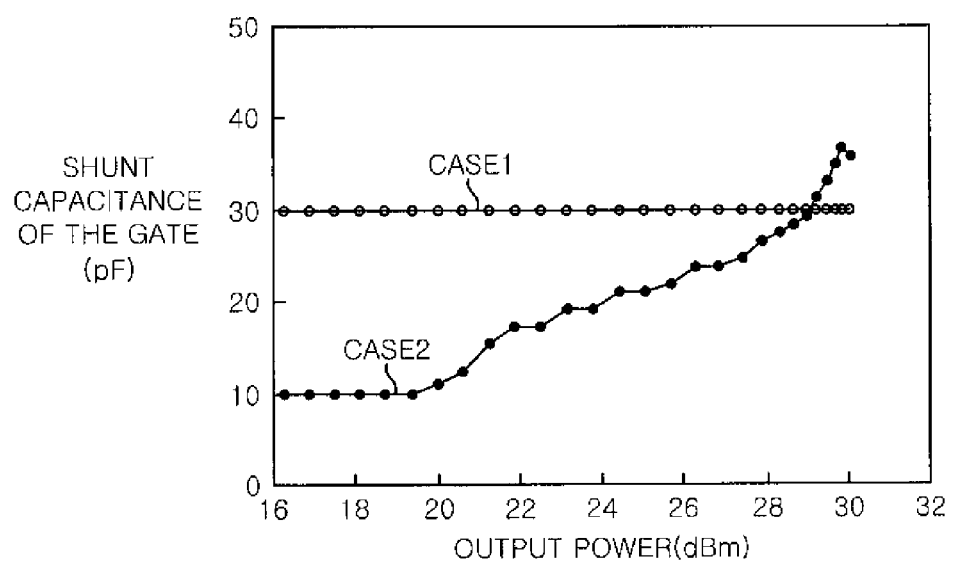
FIG. 7 is a diagram illustrating exemplary curves of gate capacitance versus output power of a conventional power amplifier and a power amplifier having a variable capacitor circuit according to a representative embodiment.

FIG. 7 is a diagram comparing exemplary curves of gate capacitance versus output power of a conventional power amplifier and a power amplifier according to a representative embodiment. In FIG. 7, CASE1 is a curve indicating gate capacitance of the conventional power amplifier having constant capacitance, and CASE2 is a curve indicating gate capacitance of the power amplifier having a variable capacitor circuit according to the representative embodiment. The variations in capacitance based on the output power of the variable capacitor circuit 201 of FIG. 2 will now be described with reference to FIGS. 1, 2 and 7.

In a small-signal operation environment, the diode D1 is turned off, and therefore, an equivalent gate capacitance defined by the variable capacitor circuit 201 is C3+(C1×C2)/(C1+C2). When the output power of the power amplifier 10 increases, the diode D1 is turned on or off in response to amplitude of a voltage applied to the gate of the transistor M2 (or amplitude of the output of the first amplification stage 100). For example, when the amplitude of the voltage of an RF signal applied to the gate of the transistor M2 is lower than the threshold voltage, the diode D1 is turned off. In contrast, when the amplitude is equal to or greater than the threshold voltage, the diode D1 is turned on. When the diode D1 is turned on, the equivalent gate capacitance is (C1+C3). When the diode D1 is turned off, the equivalent gate capacitance is C3+(C1×C2)/(C1+C2).

Since the signal amplified by the power amplifier 10 has a specific frequency and specific amplitude, the diode D1 is turned on during a first duration of each cycle, and is turned off during a second duration of each cycle. The first duration increases as the amplitude of a voltage applied to the gate of the transistor M2 increases. As the output power increases, the first duration becomes close to half of the total duration of one cycle. Meanwhile, assuming that the capacitance C2 of the second capacitor (the parasitic capacitance of the diode D1) has a very small value, the equivalent gate capacitance defined by the variable capacitor circuit 201 has a value in the range from about C3 to about C3+C1/2+(1/2)(C1×C2)/(C1+C2).

Accordingly, as shown in FIG. 7, in the conventional power amplifier (indicated by CASE1), the shunt capacitance of the gate has a constant value, and in the power amplifier 10 in accordance with the representative embodiment (indicated by CASE2), the value of the shunt capacitance of the gate increases as output power increases. For example, in the conventional power amplifier, the shunt capacitance of the gate is 30 pF, which is constant regardless of the output power. In comparison, the capacitance of the variable capacitor circuit 201 has a value in the range from about 10 pF to about 30 pF, as shown in FIG. 7, e.g., when the value of the first capacitor C1 is about 40 pF and the value of the third capacitor C3 is about 10 pF.

Figure 8:
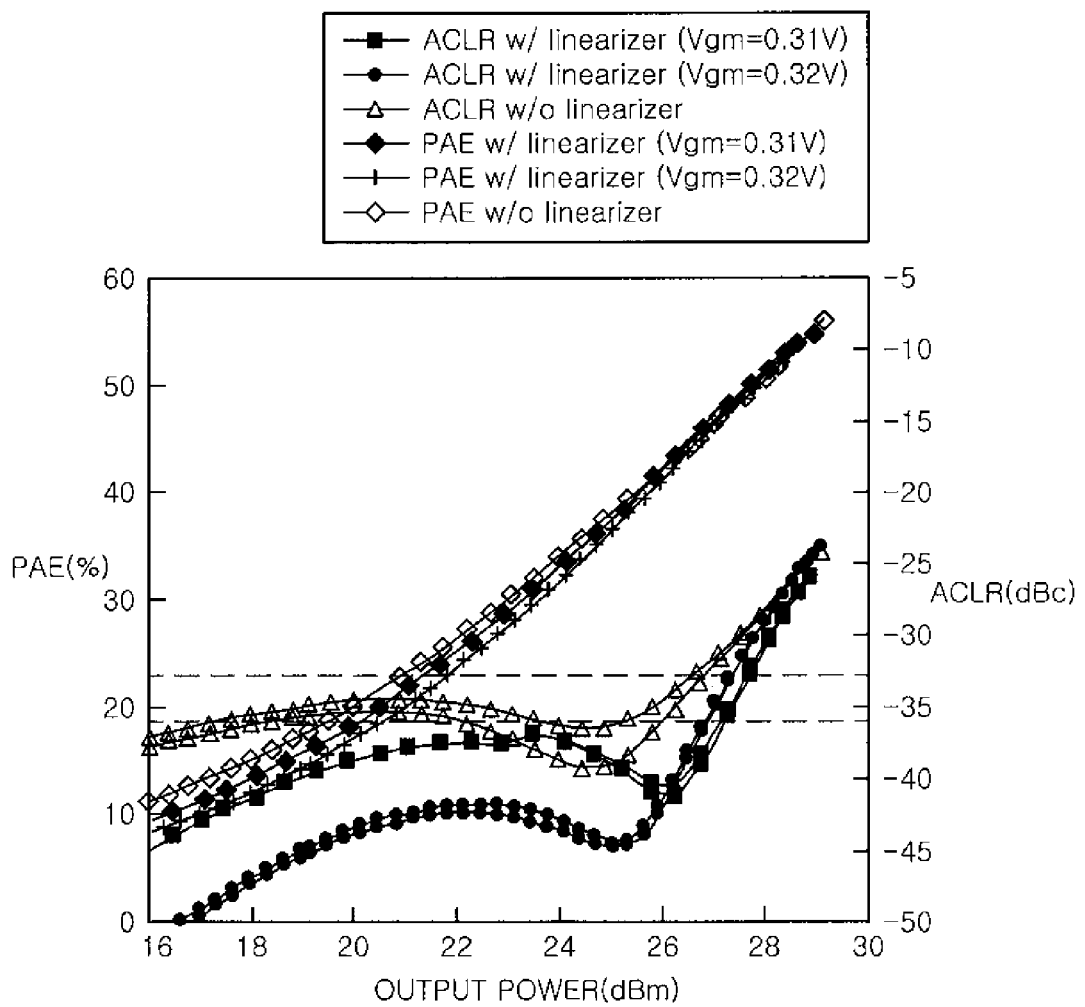
FIG. 8 is a diagram illustrating exemplary curves of Power-Added Efficiency (PAE) and Adjacent Channel Leakage Ratio (ACLR) versus output power of a power amplifier according to representative embodiments.

FIG. 8 is a diagram illustrating exemplary curves of PAE and ACLR versus output power of a power amplifier according to representative embodiments.

More particularly, FIG. 8 illustrates the PAE and the ACLR versus output power when the power amplifier employing the variable capacitor circuit 200 as a linearizer is used to amplify a Wideband-Code Division Multiple Access (WCDMA) modulation signal. FIG. 8 includes PAE and ACLR curves without a linearizer for comparison purposes, and PAE and ACLR curves with a linearizer (at different voltages) corresponding to the power amplifier according to various embodiments. As shown in FIG. 8, incorporation of the power amplifier with the linearizer considerably improved ACLR over the entire frequency band, without significant loss in PAE, as compared to the power amplifier having no linearizer.

Although the power amplifiers in accordance with the various embodiments have been described with limited numbers transistors and types of devices for convenience of description, it should be understood that additional transistors and/or different types of transistors and other devices may be utilized without departing from the scope of the present teachings.

Various embodiments may be applied to RF power amplification devices and communication devices and systems using RF power amplification devices. For example, the various embodiments may be applied to a power amplification device using CMOS transistors, and wireless systems, such as cellular handset, a mobile Internet device or a wireless personal digital assistant (PDA), including such power amplification device.

Further, various embodiments may be applied to communication systems that employ communication methods requiring high linearity. Examples of such communication systems include High Speed Downlink Packet Access (HSDPA), High Speed Uplink Packet Access (HSUPA), Enhanced Data rates for GSM Evolution (EDGE), Long Term Evolution (LTE)/4G, WiFi, Worldwide Interoperability for Microwave Access (WiMax), Code Division Multiple Access (CDMA), and Wideband-Code Division Multiple Access (WCDMA).

While specific embodiments are disclosed herein, many variations are possible, which remain within the concept and scope of the invention. Such variations would become clear after inspection of the specification, drawings and claims herein. The invention therefore is not to be restricted except within the scope of the appended claims.

What is claimed is:

1. A power amplifier, comprising:
   a first amplification stage configured to amplify a radio frequency (RF) input signal; and
   a second amplification stage comprising at least one transistor configured to amplify an output of the first amplification stage and at least one variable capacitor circuit, connected between a gate of the at least one transistor and a first power supply voltage, and configured to have a capacitance that varies in response to amplitude of the output of the first amplification stage to function as a linearizer for the power amplifier.

2. The power amplifier of claim 1, wherein each of the at least one variable capacitor circuit comprises:
   a diode circuit including a first capacitor and a diode connected in series; and
   a second capacitor connected in parallel to the diode circuit.

3. The power amplifier of claim 2, wherein the diode circuit further includes a resistor connected in parallel to the diode.

4. The power amplifier of claim 1, wherein the at least one transistor includes a first common-gate transistor and a second common-gate transistor connected in cascade to the first common-gate transistor,
   wherein the at least one variable capacitor circuit includes a first variable capacitor circuit connected between the first power supply voltage and the first common-gate transistor and a second variable capacitor circuit connected between the first power supply voltage and the second common-gate transistor,
   wherein the first variable capacitor circuit comprises:
   a first diode circuit including a first capacitor and a first diode connected in series; and
   a second capacitor connected in parallel to the first diode circuit, and
   wherein the second variable capacitor circuit includes:
   a second diode circuit including a third capacitor and a second diode connected in series, and
   a fourth capacitor connected in parallel to the second diode circuit.

5. The power amplifier of claim 1, wherein an average capacitance of each of the at least one variable capacitor circuit increases in proportion to a duration during which the voltage swing of the gate of the one of the at least one transistor has a voltage higher than a threshold voltage.

6. The power amplifier of claim 1, wherein the at least one transistor comprises a complementary metal-oxide semiconductor field-effect transistor (CMOS FET).

7. The power amplifier of claim 1, wherein the at least one transistor comprises a common-gate transistor.

8. The power amplifier of claim 1, wherein the first amplification stage comprise a common-source transistor between the first power supply voltage and the second amplification stage, and
wherein the RF input signal is input to a gate of the common-source transistor.

9. The power amplifier of claim 8, wherein the common-source transistor comprise a CMOS FET.

10. A power amplifier, comprising:
a common-source transistor configured to receive an RF signal via a gate of the common-source transistor;
a first common-gate transistor connected in cascade to the common-source transistor; and
a first variable capacitor circuit connected between a gate of the first common-gate transistor and a ground voltage, a capacitance of the first variable capacitor circuit being controlled to vary, based on a voltage swing of the gate of the first common-gate transistor, to increase linearity of the power amplifier.

11. The power amplifier of claim 10, wherein the first variable capacitor circuit comprise:
a diode circuit including a first capacitor and at least one diode connected in series to the first capacitor; and
a second capacitor connected between the gate of the common-gate transistor and the ground voltage and in parallel to the diode circuit.

12. The power amplifier of claim 11, wherein the diode circuit includes a resistor connected in parallel to the at least one diode.

13. The power amplifier of claim 10, wherein an average capacitance of the first variable capacitor circuit increases in proportion to a duration during which the voltage swing of the gate of the first common-gate transistor has a voltage higher than a threshold voltage.

14. The power amplifier of claim 10, wherein each of the common-source transistor and the first common-gate transistor is a complementary metal-oxide semiconductor field-effect transistor (CMOS FET).

15. The power amplifier of claim 10, further comprising:
a second common-gate transistor connected in cascade to the first common-gate transistor; and
a second variable capacitor circuit connected between a gate of the second common-gate transistor and the ground voltage, a capacitance of the second variable capacitor circuit being controlled to vary based on a voltage swing of the gate of the second common-gate transistor, to increase the linearity of the power amplifier.

16. A power amplifier having a linearizer, comprising:
a first amplification stage comprising a common-source transistor configured to receive an RF signal via a gate of the first amplification stage; and
a second amplification stage comprising a common-gate transistor, connected in cascade to the first amplification stage, and a variable capacitor circuit, connected between the common-gate transistor and a first power supply voltage, the second amplification stage being configured to amplify an output of the first amplification stage,
wherein the variable capacitor circuit is configured to operate as the linearizer, and comprises:
a diode circuit including a first capacitor and a diode connected in series to the first capacitor; and
a second capacitor connected between a gate of the common-gate transistor and the ground voltage and in parallel to the diode circuit.

17. The power amplifier of claim 16, wherein the diode circuit further includes a resistor connected in parallel to the diode.

18. The power amplifier of claim 16, wherein the common-source transistor comprises a complementary metal-oxide semiconductor field-effect transistor (CMOS FET).

* * * * *